US012696500B2

(12) United States Patent
Xie et al.

(10) Patent No.: US 12,696,500 B2
(45) Date of Patent: Jul. 28, 2026

(54) FIRST AND SECOND NANOSHEET TRANSISTORS HAVING RESPECTIVE FIRST AND SECOND CHANNEL STRUCTURES WHEREIN A SECOND SOURCE/DRAIN STRUCTURE OF THE SECOND NANOSHEET TRANSISTOR WRAPS AROUND THE ENDS OF THE SECOND CHANNEL STRUCTURES

(71) Applicant: International Business Machines Corporation, Armonk, NY (US)

(72) Inventors: Ruilong Xie, Niskayuna, NY (US); Tenko Yamashita, Schenectady, NY (US); Teresa J. Wu, Rexford, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 541 days.

(21) Appl. No.: 17/883,114

(22) Filed: Aug. 8, 2022

(65) Prior Publication Data

US 2024/0047525 A1     Feb. 8, 2024

(51) Int. Cl.
H10D 62/10 (2025.01)
H10D 30/01 (2025.01)
(Continued)

(52) U.S. Cl.
CPC ......... H10D 62/121 (2025.01); H10D 30/014 (2025.01); H10D 30/43 (2025.01);
(Continued)

(58) Field of Classification Search
CPC .... H10D 62/121; H10D 30/014; H10D 30/43; H10D 30/6755; H10D 30/6757;
(Continued)

(56) References Cited

U.S. PATENT DOCUMENTS

| 10,141,403 B1 | 11/2018 | Cheng et al. |
| 10,229,971 B1 | 3/2019 | Cheng et al. |

(Continued)

FOREIGN PATENT DOCUMENTS

| WO | 2021259478 | 12/2021 |

OTHER PUBLICATIONS

Ranka et al., Performance Evaluation of FD-SOI MOSFETs For Different Metal Gate Work Function, Mar. 2011, International Journal of VLSI Design & Communication Systems (VLSICS), vol. 1 No. 1, pp. 11-24 (Year: 2011).*

(Continued)

*Primary Examiner* — William B Partridge
*Assistant Examiner* — Erik A. Anderson
(74) *Attorney, Agent, or Firm* — Seed Intellectual Property Law Group LLP

(57) ABSTRACT

A semiconductor device includes a substrate; a first nanosheet transistor, which is located on the substrate, that has a first inter-channel spacing and that has a thin gate oxide layer; and a second nanosheet transistor, which is located on the substrate, that has a second inter-channel spacing that is greater than the first inter-channel spacing and that has a thick gate oxide layer that is thicker than the thin gate oxide layer of the first nanosheet transistor. The second nanosheet transistor comprises channel structures and a source/drain structure that wraps around the ends of the channel structures. In embodiments, there are inner spaces at ends of the gate stacks in the first transistor, but not at the ends of the gate stacks in the second transistor.

11 Claims, 12 Drawing Sheets

(51) Int. Cl.

| | |
|---|---|
| *H10D 30/43* | (2025.01) |
| *H10D 30/67* | (2025.01) |
| *H10D 62/13* | (2025.01) |
| *H10D 64/01* | (2025.01) |
| *H10D 84/01* | (2026.01) |
| *H10D 84/03* | (2025.01) |

(52) U.S. Cl.
CPC ..... *H10D 30/6755* (2025.01); *H10D 30/6757* (2025.01); *H10D 62/151* (2025.01); *H10D 64/017* (2025.01); *H10D 84/0128* (2025.01); *H10D 84/013* (2025.01); *H10D 84/038* (2025.01)

(58) Field of Classification Search
CPC ............... H10D 62/151; H10D 64/017; H10D 84/0128; H10D 84/013; H10D 84/038; H10D 30/6735; H10D 62/116; H10D 84/83
See application file for complete search history.

(56) References Cited

U.S. PATENT DOCUMENTS

| | | | |
|---|---|---|---|
| 10,243,054 | B1 | 3/2019 | Cheng |
| 10,886,368 | B2 | 1/2021 | Zhang |
| 11,101,182 | B2 | 8/2021 | Cheng |
| 11,101,359 | B2 | 8/2021 | Wu |
| 11,205,698 | B2 | 12/2021 | Ando |
| 11,211,474 | B2 | 12/2021 | Siddiqui |
| 2019/0287864 | A1 * | 9/2019 | Cheng ................. H10D 62/121 |
| 2020/0066839 | A1 * | 2/2020 | Zhang ................. H10D 30/014 |
| 2021/0184001 | A1 * | 6/2021 | Trivedi ............. H10D 30/6757 |
| 2021/0217873 | A1 * | 7/2021 | Siddiqui ............... H10D 30/43 |
| 2021/0367034 | A1 * | 11/2021 | Chang ................. H10D 62/121 |
| 2022/0085161 | A1 * | 3/2022 | Noh ....................... H10D 64/68 |

OTHER PUBLICATIONS

Loic Gaben. Fabrication and Characterization of Gate-All-Around Stacked-Nanowire/Nanosheet MOS transistors realized by a Gate-Last approach for sub-7 nm technology nodes.. Micro and nanotechnologies/Microelectronics. Université Grenoble Alpes, 2017. English. ?NNT : 2017GREAT095?. ?tel-01780190. Published Apr. 2018. pp. 1-149.

* cited by examiner

204

106

208

202

206

104

102

104

102

104

102

104

106

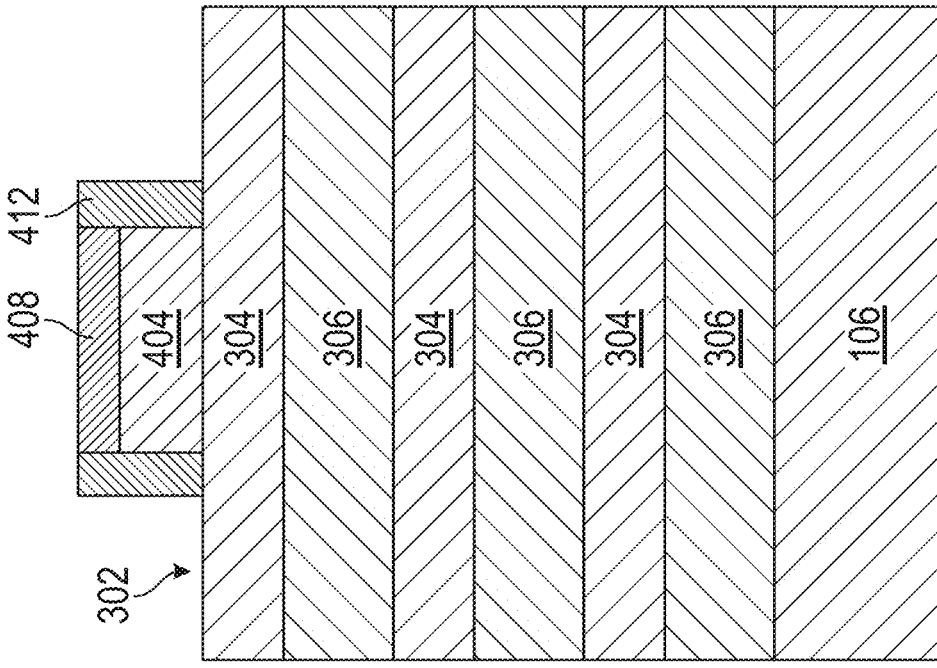
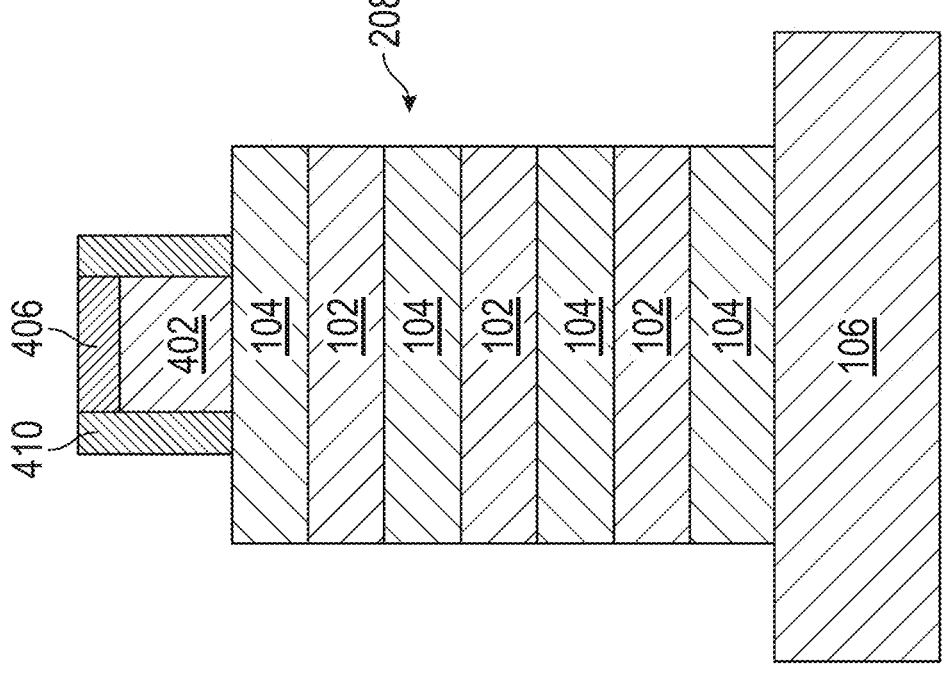
*FIG. 4*

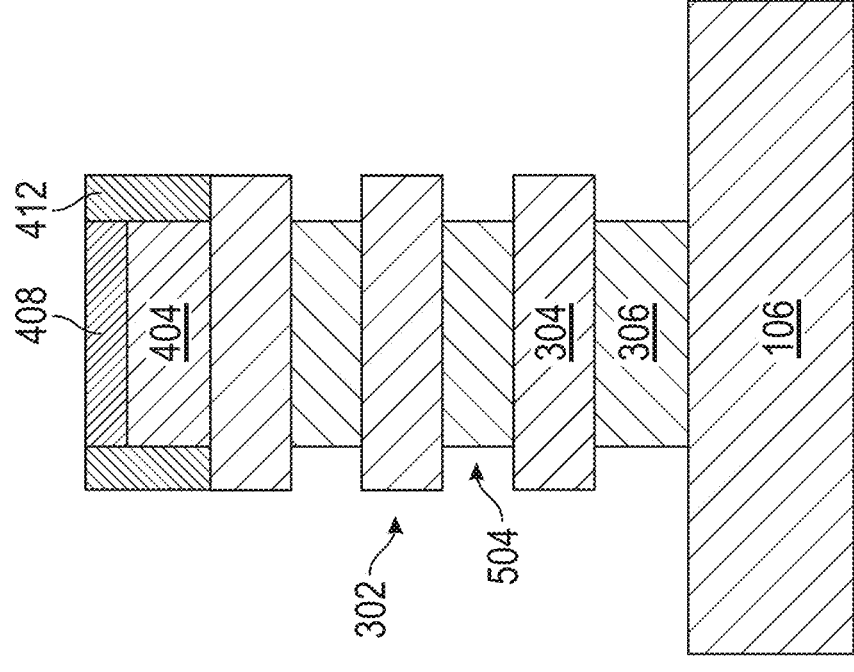
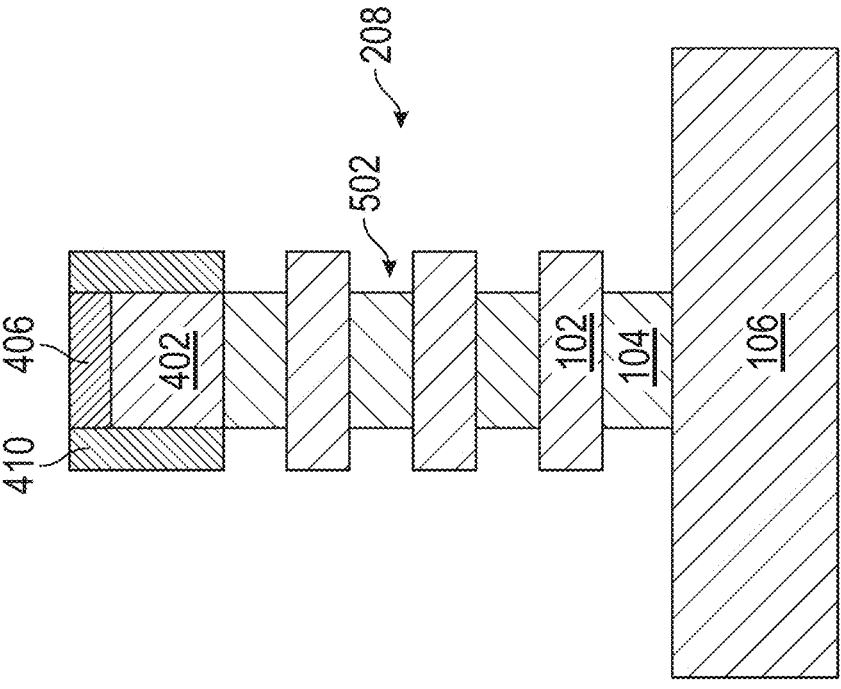
*FIG. 5*

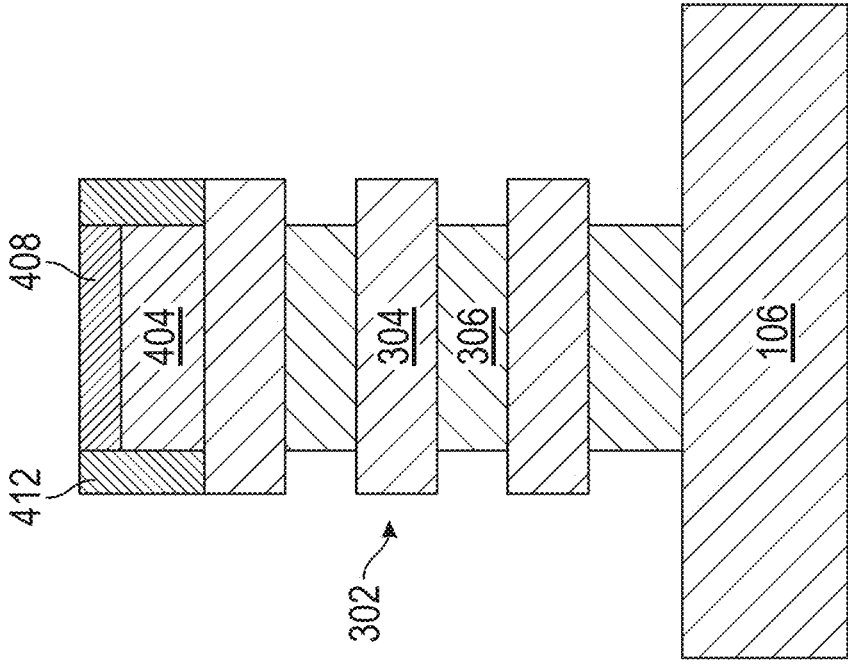
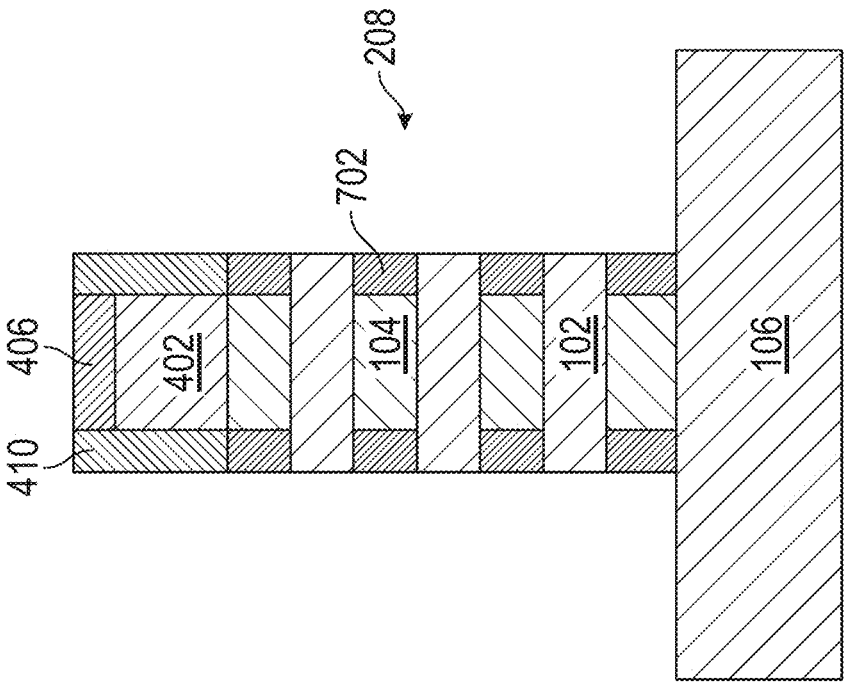
*FIG. 7*

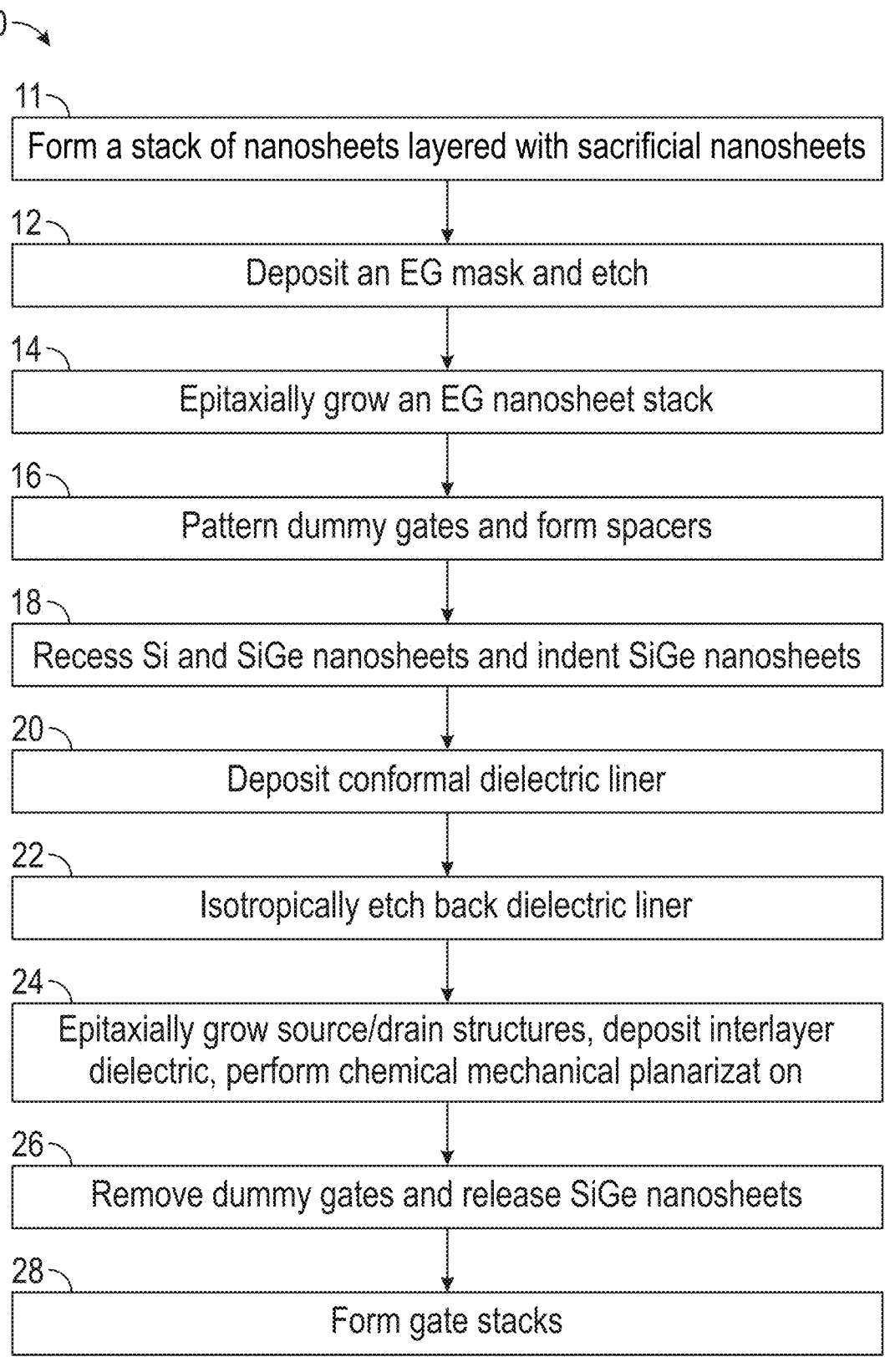

10

11 — Form a stack of nanosheets layered with sacrificial nanosheets

12 — Deposit an EG mask and etch

14 — Epitaxially grow an EG nanosheet stack

16 — Pattern dummy gates and form spacers

18 — Recess Si and SiGe nanosheets and indent SiGe nanosheets

20 — Deposit conformal dielectric liner

22 — Isotropically etch back dielectric liner

24 — Epitaxially grow source/drain structures, deposit interlayer dielectric, perform chemical mechanical planarizat on 26 — Remove dummy gates and release SiGe nanosheets 28 — Form gate stacks

*FIG. 11*

FIRST AND SECOND NANOSHEET TRANSISTORS HAVING RESPECTIVE FIRST AND SECOND CHANNEL STRUCTURES WHEREIN A SECOND SOURCE/DRAIN STRUCTURE OF THE SECOND NANOSHEET TRANSISTOR WRAPS AROUND THE ENDS OF THE SECOND CHANNEL STRUCTURES

BACKGROUND

The present invention relates to the electrical, electronic, and computer arts, and more specifically, to semiconductor fabrication. More specifically, the present invention relates to co-integrated fabrication processes and resulting structures for forming standard-gate and extended-gate nanosheet/nanowire transistors on the same substrate.

In contemporary semiconductor device fabrication processes, a large number of semiconductor devices, such as silicon channel n-type field effect transistors (nFETs) and silicon germanium channel p-type field effect transistors (pFETs), are fabricated on a single wafer. Non-planar transistor device architectures, such as nanosheet (or nanowire) transistors, can provide increased device density and increased performance over planar transistors. Nanosheet transistors, in contrast to conventional planar FETs, include a gate stack that wraps around the full perimeter of multiple nanosheet channel regions for improved control of channel current flow. Nanosheet transistor configurations enable fuller depletion in the nanosheet channel regions and reduce short-channel effects. In order to increase the maximum gate voltage of certain transistors, so-called extended gate (EG) nanosheet transistors have been developed that include a larger volume of gate metal and/or a thicker gate oxide than so-called standard-gate (SG) nanosheet transistors.

SUMMARY

Principles of the invention provide techniques for co-integrating thin gate oxide and thick gate oxide nanosheet transistors. In one aspect, an exemplary semiconductor device includes: a semiconductor substrate; a first nanosheet transistor, which is located on the substrate, that has a first inter-channel spacing and that has a thin gate oxide layer; and a second nanosheet transistor, which is located on the substrate, that has a second inter-channel spacing that is greater than the first inter-channel spacing and that has a thick gate oxide layer that is thicker than the thin gate oxide layer of the first nanosheet transistor. The second nanosheet transistor includes channel structures and a source/drain structure that wraps around the ends of the channel structures.

In another aspect, an exemplary method includes: forming a first stack of first channel nanosheets layered with first sacrificial nanosheets, wherein the first sacrificial nanosheets are of a first thickness; masking and etching the first stack to form an open area; and forming, in the open area, a second stack of second channel nanosheets layered with second sacrificial nanosheets, wherein the second sacrificial nanosheets are of a second thickness that is greater than the first thickness.

In view of the foregoing, techniques of the present invention can provide substantial beneficial technical effects. For example, one or more embodiments provide one or more of:

Co-integration of transistors with thin gate oxide (also called standard gate (SG) transistors) and transistors with thick gate oxide (also called extended gate (EG)

transistors) on the same die using nanosheet technology for both types of transistor.

Differentiation of nanosheet (inter-channel) spacing in SG and EG transistors on the same die.

Differentiation of nanosheet width/gate length in SG and EG transistors on the same die.

Differentiation of nanosheet thickness in SG and EG transistors on the same die.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

BRIEF DESCRIPTION OF THE DRAWINGS

FIG. 4 depicts the SG and EG nanosheet stacks after steps of dummy gate patterning and spacer formation.

FIG. 5 depicts the SG and EG nanosheet stacks after steps of nanosheet recess and SiGe indentation.

FIG. 7 depicts the SG and EG nanosheet stacks after a step of isotropically etching back the dielectric liner.

FIG. 11 depicts in a flowchart a method for processing the precursor stack that is shown in FIG. 1 to produce the final structures that are shown in FIG. 10.

DETAILED DESCRIPTION

Figure 1:
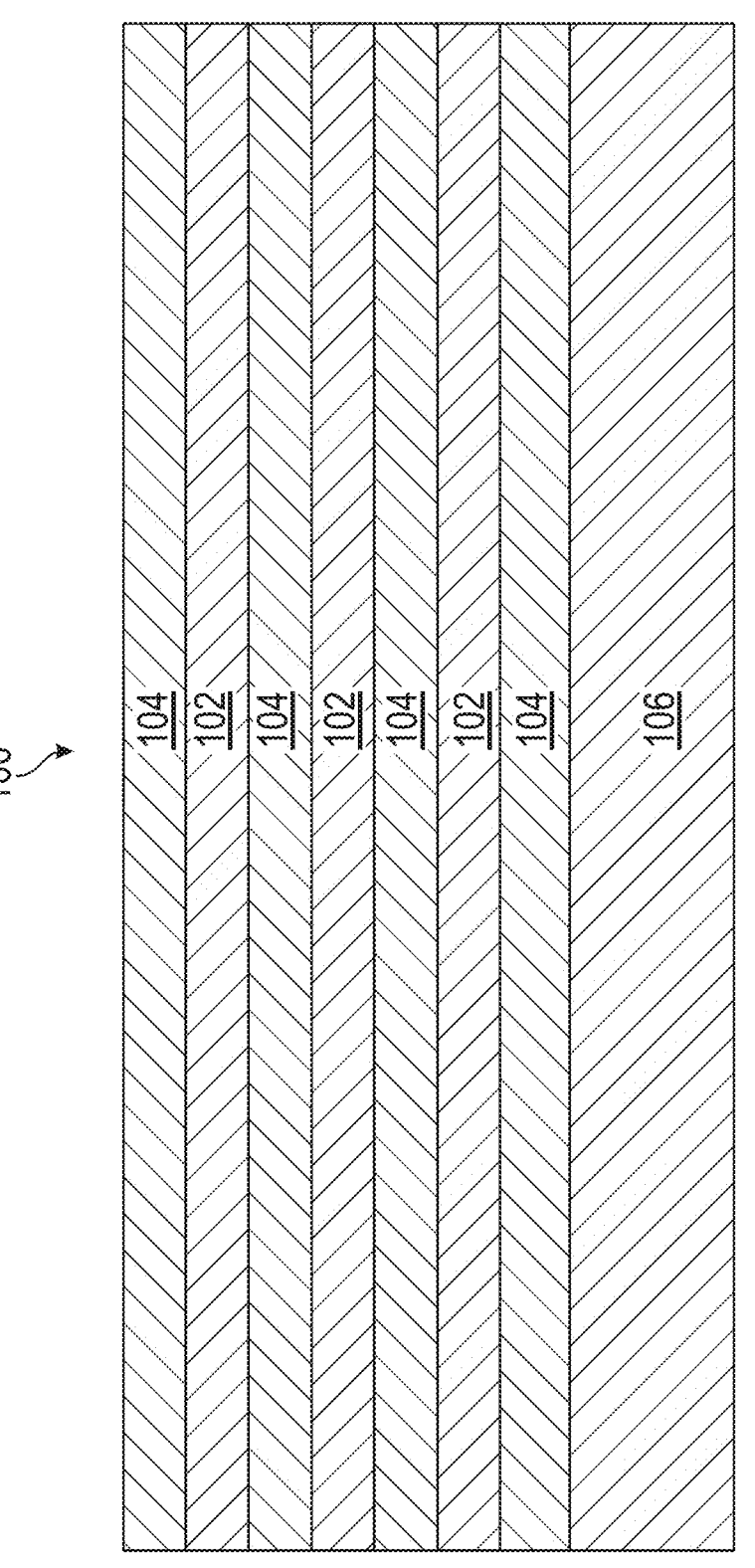
FIG. 1 depicts a homogeneous precursor stack of layered silicon (Si) and silicon-germanium (SiGe) nanosheets.

FIG. 1 depicts a homogeneous precursor stack 100 of layered silicon (Si) channel nanosheets 102 and silicon-germanium (SiGe) sacrificial nanosheets 104 on a silicon (or other semiconductor) substrate 106. In one or more embodiments, the nanosheets have been epitaxially grown from the substrate. FIGS. 2-10 depict intermediate and final structures that are formed according to a method 10, which is shown in FIG. 11.

Figure 2:
FIG. 2 depicts standard gate (SG) and expanded gate (EG) precursor regions after steps of EG mask and etch.
Figure 12:
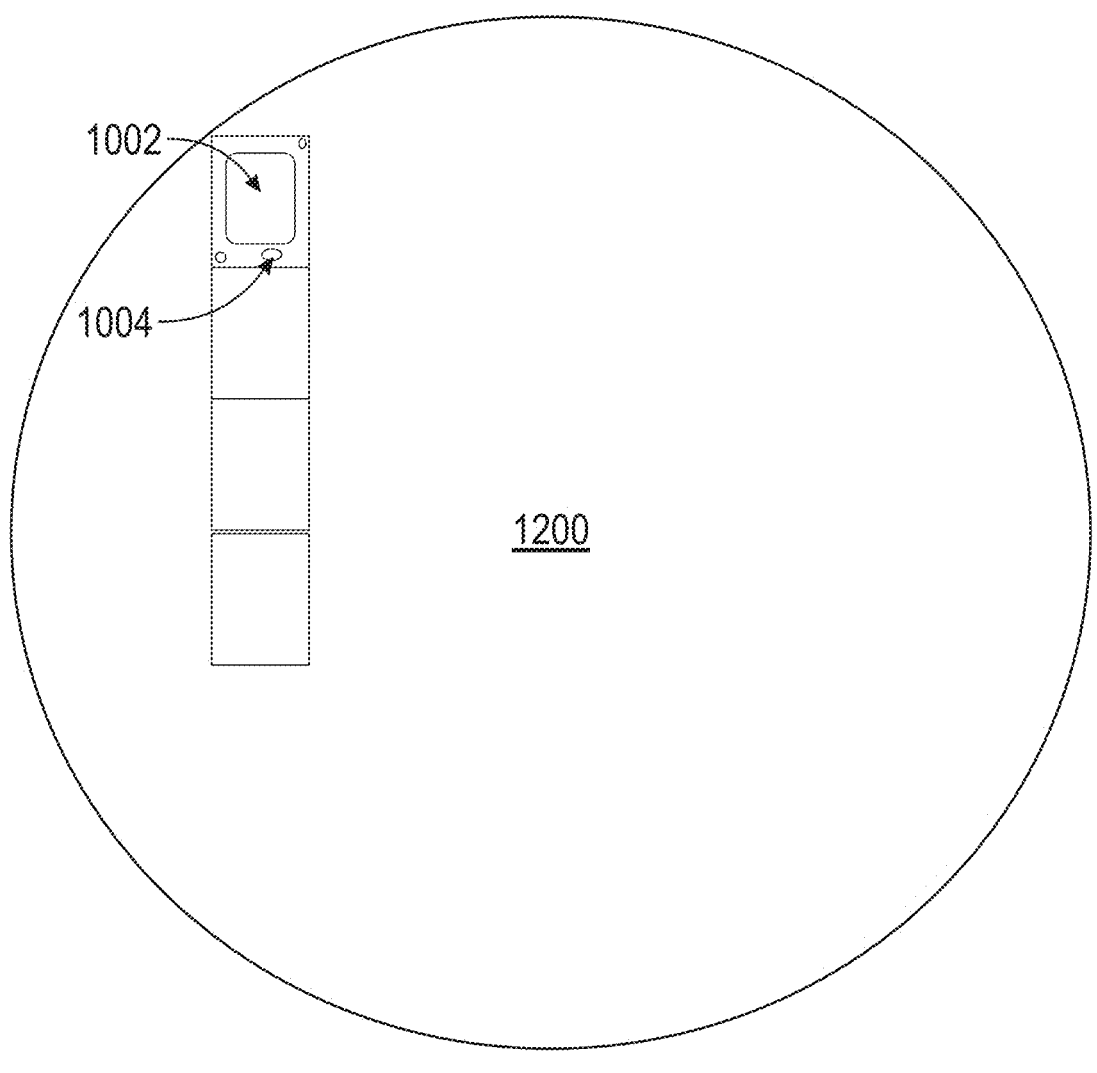
FIG. 12 depicts a layout of SG and EG transistors on a semiconductor wafer.

FIG. 2 depicts a thin gate oxide transistor (SG) precursor region 202 and an open area 204 in the thick gate oxide transistor (EG) region after steps 12 (as shown in FIG. 11) of EG patterning and etch. Note that the substrate 106 is shown in two pieces only for convenience of illustration, because the SG region is separated and spaced apart from EG region as shown in FIG. 12. Note, also, the photolithographic EG mask 206 atop the SG precursor region 202; the EG mask was deposited prior to etching, and protected the Si nanosheet layers 102 and the SiGe nanosheet layers 104 from the etching step. The skilled artisan is familiar with photolithography, and, given the teachings herein, can use known lithographic techniques to implement one or more embodiments. Thus, an SG nanosheet stack 208 is defined in the SG precursor region 202.

Figure 3:
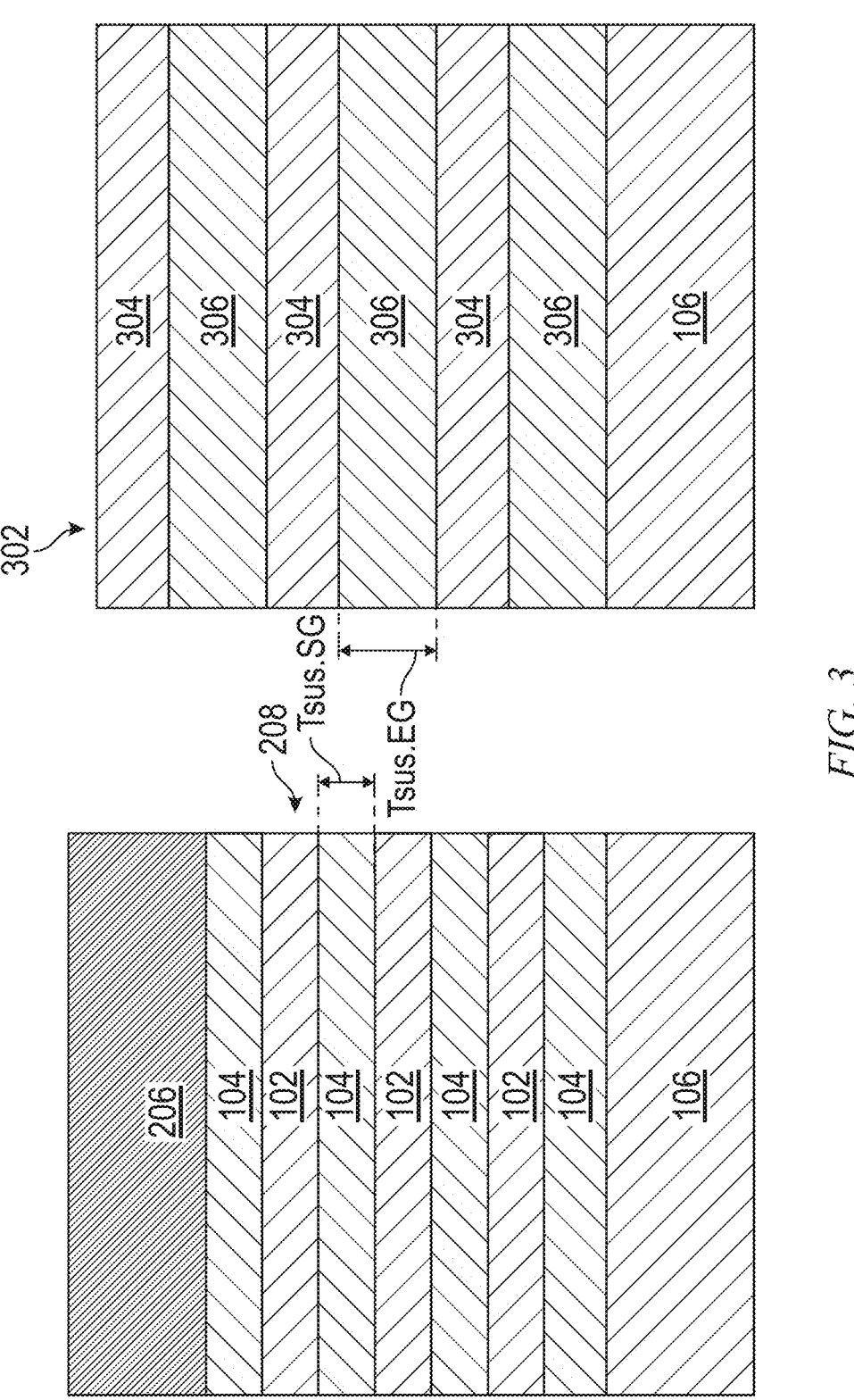
FIG. 3 depicts the SG and EG precursor regions after a step of epitaxial growth of an EG nanosheet stack.

FIG. 3 depicts the SG nanosheet stack 208 and an EG nanosheet stack 302 after a step 14 (as shown in FIG. 11) of epitaxially growing the EG nanosheet stack 302 from the substrate 106. The EG nanosheet stack 302 includes Si channel nanosheets 304 that are layered with SiGe sacrificial nanosheets 306. The nanosheets 304, 306 may be of different thicknesses than the nanosheets 102, 104 of the SG nanosheet stack 208. For example, the sacrificial nanosheets 306 are thicker than the sacrificial nanosheets 104. The sacrificial nanosheets 104, 306 can include, for example, SiGe with the Ge % ranging from 15-75%. The skilled artisan will be familiar with generalities of fabricating nanosheet transistors and with the utilization of sacrificial nanosheets in such fabrication, and, given the teachings herein, will be able to adapt known techniques to implement one or more embodiments. Thus, an inter-channel spacing Tsus. SG in the SG nanosheet stack 208 is smaller than a corresponding inter-channel spacing Tsus.EG in the EG nanosheet stack 302. In one or more embodiments, Tsus. SG is on the order of about 5 nm to about 15 nm, whereas Tsus.EG is on the order of about 15 nm to about 30 nm. Additionally, the channel nanosheets 304 may be of different thickness than the channel nanosheets 102. For example, the channel nanosheets 304 may be thicker than the channel nanosheets 102. For example, in one or more embodiments the first channel structures (channel nanosheets 102) are between about 4 nm and about 8 nm thick, whereas the second channel structures (channel nanosheets 304) are between about 4 nm and about 12 nm thick.

FIG. 4 depicts the SG and EG nanosheet stacks 208, 302 after steps 16 (as shown in FIG. 11) of dummy gate patterning and spacer formation. There are dummy gates 402, 404 atop the respective stacks 208, 302. Although each dummy gate is shown as a unitary structure to avoid clutter, in practice, dummy gates can include, e.g., a thin $SiO_2$ liner plus amorphous silicon (a-Si) in a known manner. For example, after thin liner deposition, deposit amorphous Si material and carry out planarization; and deposit gate hardmask material (can be, e.g., a multilayer dielectric). The skilled artisan will be familiar with generalities of the dummy gate process, and, given the teachings herein, will be able to adapt known techniques to implement one or more embodiments. Hard masks 406, 408 cover the respective dummy gates 402, 404 and dielectric spacers 410, 412 flank the dummy gates and hard masks. In one or more embodiments, the dummy gate 404 may be wider than the dummy gate 402, so that the hard mask 408 and the spacers 412 together cover a wider extent of the EG nanosheet stack 302 compared to how much of the SG nanosheet stack 208 is covered by the hard mask 406 and the spacers 410.

FIG. 5 depicts the SG and EG nanosheet stacks 208, 302 after steps 18 (as shown in FIG. 11) of nanosheet recess and SiGe indentation. During steps 18, the dielectric spacers 410, 412 defined etch-free areas during anisotropic vertical etching of all of the nanosheets; one example of anisotropic etching is reactive ion etching (ME). Then, selective isotropic etching (e.g., plasma etching or wet etching) has been employed to preferentially etch and indent the sacrificial SiGe nanosheets. This selective etching and indenting forms recesses 502, 504 in the sacrificial SiGe layers between the Si nanosheets 102, 304 of the respective SG nanosheet stack 208 and EG nanosheet stack 302. Note that the recesses 504 are larger than the recesses 502 because Tsus.EG is greater than Tsus. SG. Note, also, that in one or more embodiments, after steps 18 the EG nanosheet stack 302 is wider than the SG nanosheet stack 208. In one or more embodiments, the EG device will have a longer gate length than the SG device.

Figure 6:
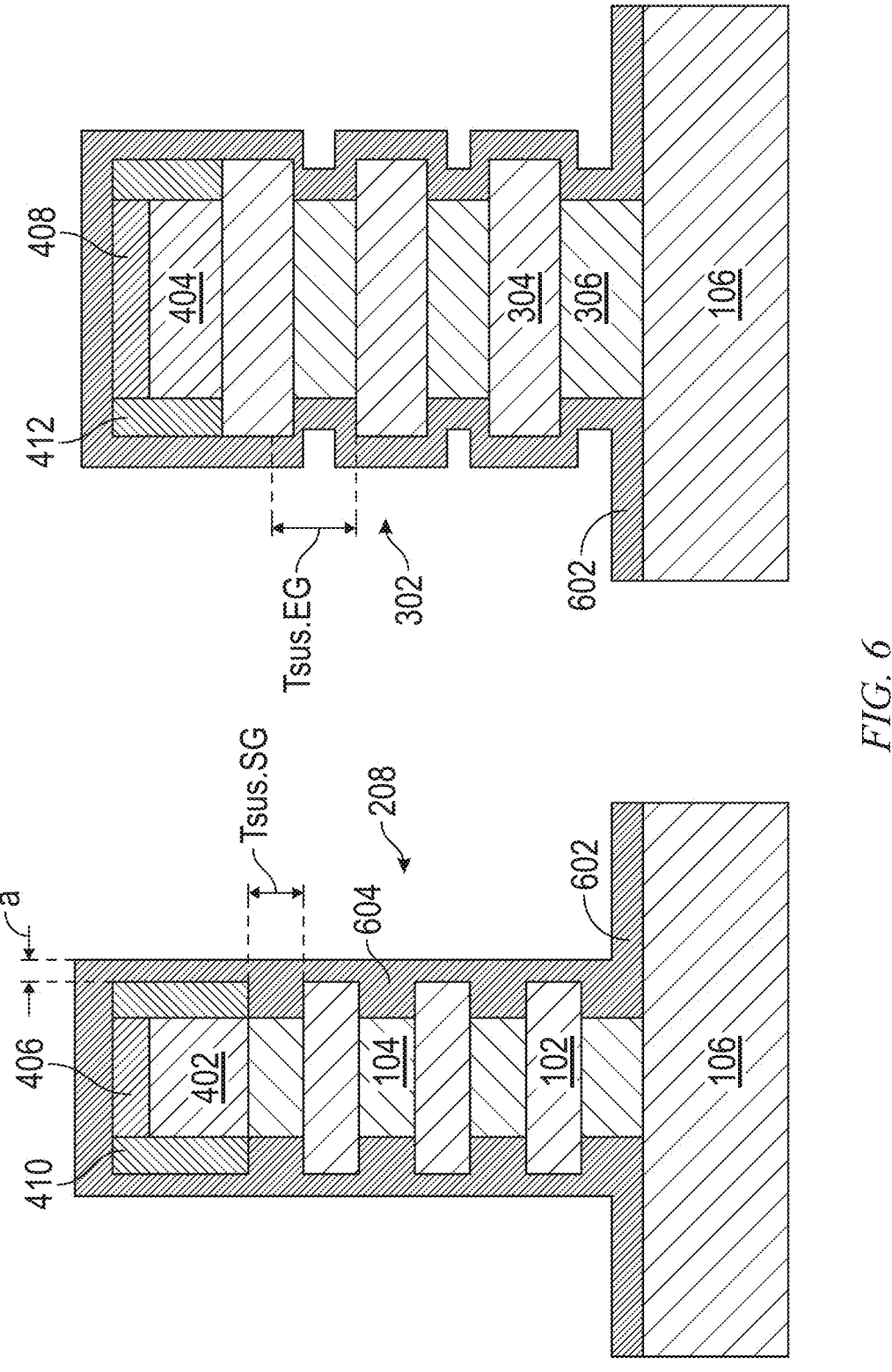
FIG. 6 depicts the SG and EG nanosheet stacks after a step of depositing a conformal dielectric liner.

FIG. 6 depicts the SG and EG nanosheet stacks 208, 302 after a step 20 (as shown in FIG. 11) of depositing a conformal dielectric liner 602 to a thickness "a." In one or more embodiments, thickness "a" is limited by inter-gate spacing CPP. Note that "a" is equal to or exceeds one half of Tsus.SG. Therefore, depositing the liner 602 to thickness "a" forms pinch-off regions 604 between the ends of the Si nanosheets 102 in the SG nanosheet stack 208. Note that, because Tsus.EG is larger than Tsus.SG, there are no pinch-off regions between the Si nanosheets 304 in the EG nanosheet stack 302.

FIG. 7 depicts the SG and EG nanosheet stacks 208, 302 after a step 22 (as shown in FIG. 11) of isotropically etching back the dielectric liner 602. Note that, because the pinch-off regions 604 were present after step 20, inner spacers 702 remain in the SG nanosheet stack 208. There are no inner spacers in the EG nanosheet stack 302. Advantageously, this means that in a later step the source/drain regions 804 (shown in FIG. 8) can wrap around ends of the channel structure nanosheets 304, which could enhance the switching characteristics of the EG transistors.

Figure 8:
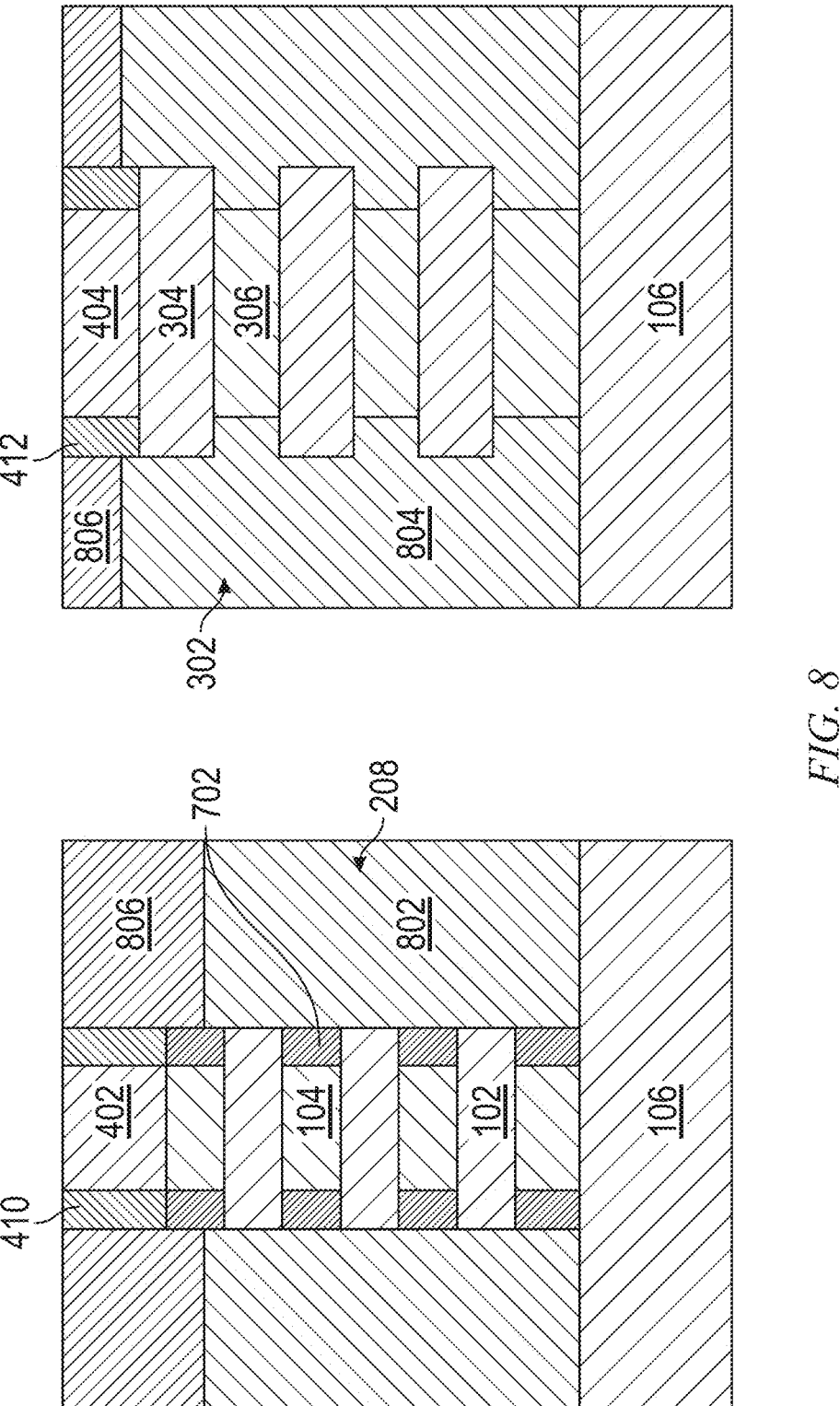
FIG. 8 depicts the SG and EG nanosheet stacks after steps of source/drain epitaxial growth, interlayer dielectric deposition, and chemical mechanical planarization.

FIG. 8 depicts the SG and EG nanosheet stacks 208, 302 after steps 24 (as shown in FIG. 11) of source/drain epitaxial growth, interlayer dielectric deposition, and chemical mechanical planarization. Note that the inner spacers 702 separate the source/drain structures 802 adjacent to the SG nanosheet stack 208 from the SiGe nanosheets 104. By contrast, the source/drain structures 804 that are adjacent to the EG nanosheet stack 302 directly contact the SiGe nanosheets 306. The interlayer dielectric 806 covers both SG and EG nanosheet stacks 208, 302.

Figure 9:
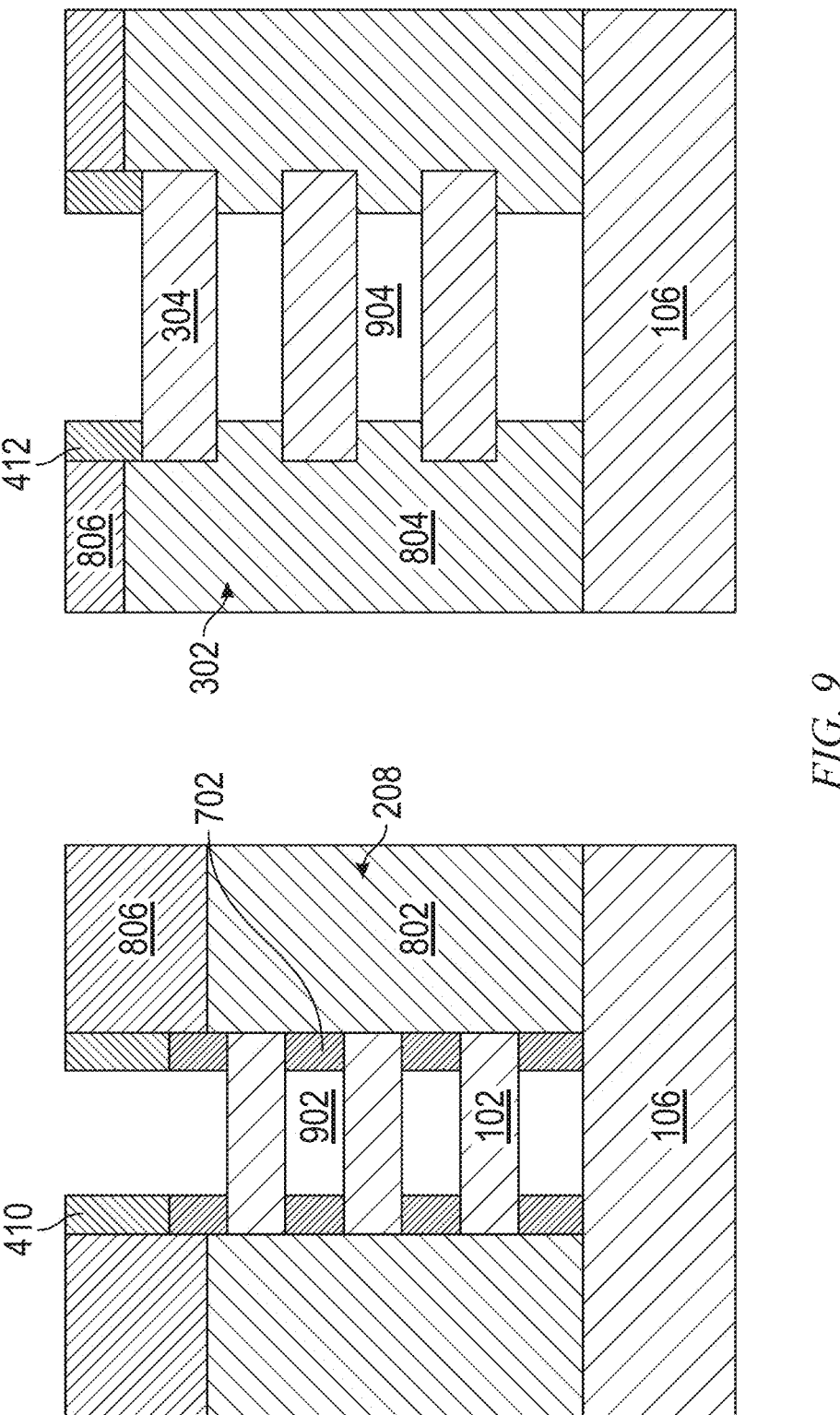
FIG. 9 depicts the SG and EG nanosheet stacks after steps of dummy gate removal and SiGe release.

FIG. 9 depicts remnants of the SG and EG nanosheet stacks 208, 302 after steps 26 (as shown in FIG. 11) of dummy gate removal and SiGe release. Note the cavities 902, 904 that will be filled by the actual gate stacks (e.g., HKMG). The skilled artisan is familiar with removal or release of dummy gates and sacrificial nanosheets, and with the formation of high-k metal gates (HKMG) in place of the dummy gates. In one or more embodiments, the cavities 902, 904 may be filled in multiple deposition steps, so that several discrete layers of material are built up from the cavity walls inward.

Figure 10:
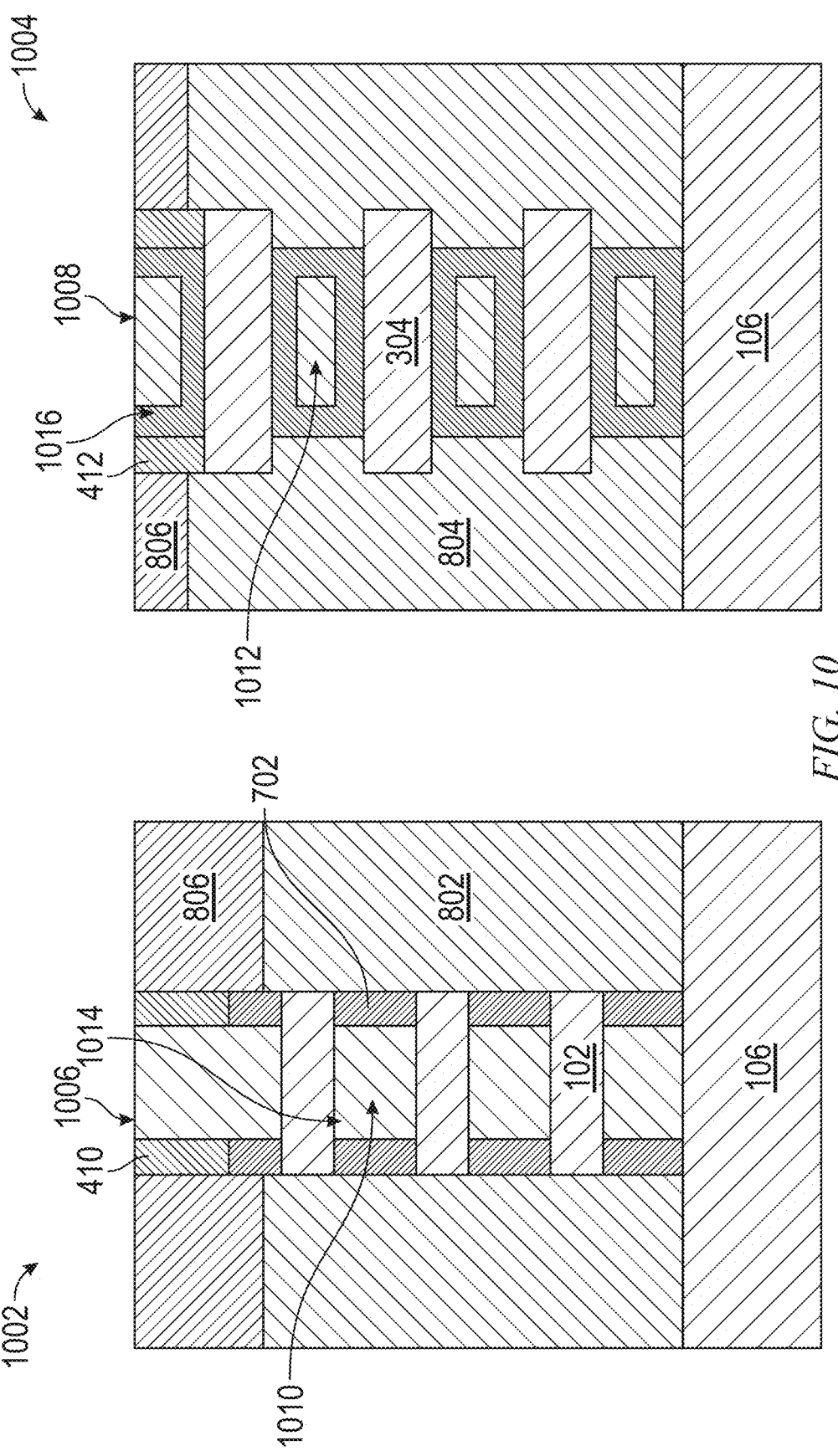
FIG. 10 depicts final structures of SG and EG transistors after steps of gate stack formation.

FIG. 10 depicts final structures of the SG and EG transistors 1002, 1004 after step 28 (as shown in FIG. 11) of gate stack formation. The gate stacks 1006, 1008 respectively include work function metals 1010, 1012 and dielectric oxides 1014, 1016. In one or more embodiments, a work function metal of the SG transistors 1002 is different than a work function metal of the EG transistors 1004. In one or more embodiments, a dielectric oxide of both the SG and EG transistors 1014, 1016 includes silicon dioxide ($SiO_2$) and dielectrics with different thickness. The thickness of the $SiO_2$ in the SG device may be <1 nm, and the thickness of the SiO2 in the EG device could be thicker than 3 nm. Generally, a high-k dielectric material will be suitable for the gate stack dielectrics; e.g., a material that incorporates hafnium oxide (HfO), zirconium oxide (ZrO), or titanium oxide (TiO) with dielectric constant (k) on the order of 3-15 times higher than that of silicon dioxide ($SiO_2$) alone, e.g., on the order of 10-50. Generally, oxides of refractory metals provide high-k dielectrics. In one or more embodiments, dielectric oxide thickness of the SG transistors 1002 is on the order of about 0.5 nm to about 1.5 nm, for example, about 0.7 nm. In one or more embodiments, the dielectric oxide thickness of the EG transistors 1004 is on the order of about 3 nm to about 7 nm, for example, about 4.5 nm. Thus, embodiments of the invention provide, on the same semiconductor die or wafer, one or more SG transistors 1002 that are "thin oxide" transistors, alongside one or more EG transistors that are "thick oxide" transistors. Note that in the thin oxide SG transistors 1002, the inner spacers 702 separate the source/drain structures 802 from the gate stack 1006, whereas in the thick oxide EG transistors 1004, the source/drain structures 804 directly contact the oxide 1016 of the gate stack 1008.

Forming the gate stacks 1006, 1008 completes the transistors 1002, 1004 so that, when the gate stacks are energized, conductive channels will be formed in the nanosheets 102, 304 in a manner familiar to the ordinary skilled worker. Thus, in the completed transistors, the nanosheets 102, 304 can be referred to as "channel structures." Because the source/drain structures 804 wrap around ends of the channel structures 304 in the EG transistors 1004, lower "underspace region" resistance is achieved for the EG device, which does not degrade the short channel effect since the gate length is long.

FIG. 11 depicts in a flowchart a method 10 for processing the precursor stack that is shown in FIG. 1 to produce the final structures that are shown in FIG. 10. At 11, form a first stack of first channel nanosheets 102 layered with first sacrificial nanosheets 104. At 12, deposit an EG mask 206 and etch, e.g., using photolithographic methods, as shown in FIG. 2. At 14, epitaxially grow an EG nanosheet stack, as shown in FIG. 3. At 16, pattern dummy gates and form spacers, as shown in FIG. 4. At 18, recess the Si and SiGe nanosheets and indent the SiGe nanosheets, as shown in FIG. 5. At 20, deposit a conformal dielectric liner, as shown in FIG. 6. At 22, isotropically etch back the dielectric liner, as shown in FIG. 7—note the pinch-off regions 604 that become the inner spacers 702. At 24, epitaxially grow source/drain structures, deposit the interlayer dielectric, and perform chemical mechanical planarization, as shown in FIG. 8. At 26, remove the dummy gates and release the SiGe nanosheets, as shown in FIG. 9. At 28, form the gate stacks (e.g., high-K metal gates), as shown in FIG. 10.

FIG. 12 depicts a layout of SG and EG transistors 1002, 1004 on a semiconductor wafer 1200. Note that the two types of transistors are alongside each other on the same die. In one or more embodiments, the process steps to form the transistors are performed on the wafer 1200 as a whole. Thus, although the different nanosheet stacks 208, 302 are shown in the drawings as separate bodies, it should be remembered that all operations are performed on both stacks, and that different results on the different stacks occur as a result of masking either stack to prevent an operation taking effect; for example, during growth of the EG nanosheet stack 302, the SG nanosheet stack 208 is covered by the hard mask 206, which prevents epitaxial formation.

Given the discussion thus far, it will be appreciated that, in general terms, an aspect of the invention provides a semiconductor device, which includes: a semiconductor substrate 106; a first nanosheet transistor 1002, which is located on the substrate, that has a first inter-channel spacing and that has a thin gate oxide layer; and a second nanosheet transistor 1004, which is located on the substrate, that has a second inter-channel spacing that is greater than the first inter-channel spacing and that has a thick gate oxide layer that is thicker than the thin gate oxide layer of the first nanosheet transistor. The second nanosheet transistor includes channel structures 304 and a source/drain structure 804 that wraps around the ends of the channel structures.

In one or more embodiments, the second nanosheet transistor includes a source/drain structure 804 that directly contacts the thick gate oxide layer 1016 of the second nanosheet transistor, and the first nanosheet transistor includes a source/drain structure 802 and also includes inner spacers 702 that separate the source/drain structure of the first nanosheet transistor from the thin gate oxide layer 1014 of the first nanosheet transistor. In one or more embodiments, a thickness of the inner spacers of the first nanosheet transistor is one-half of the first inter-channel spacing.

In one or more embodiments, the first nanosheet transistor includes a first metal gate stack and the second nanosheet transistor includes a second high-k metal gate stack. In one or more embodiments, the first high-k metal gate stack includes a first work function metal, and the second high-k metal gate stack includes a second work function metal that is different than the first work function metal. In one or more embodiments, the first high-k metal gate stack includes a high-k dielectric that includes silicon. In one or more embodiments, the high-k dielectric of the first high-k metal gate stack includes hafnium. In one or more embodiments, the high-k dielectric of the first high-k metal gate stack includes silicon dioxide and hafnium dioxide.

In one or more embodiments, the first high-k metal gate stack includes a first high-k dielectric, and the second high-k metal gate stack includes a second high-k dielectric that includes a different oxide than is included in the first high-k dielectric.

In one or more embodiments, the first nanosheet transistor includes first channel structures of a first thickness and the second nanosheet transistor includes second channel structures of a second thickness that is different than the first thickness. In one or more embodiments, the first channel structures are between about 4 nm and about 8 nm thick, wherein the second channel structures are between about 4 nm and about 12 nm thick.

In one or more embodiments, the first nanosheet transistor includes first channel structures of a first length and the second nanosheet transistor includes second channel structures of a second length that is different than the first length.

In one or more embodiments, the first inter-channel spacing is between about 5 nm to about 15 nm, and the second inter-channel spacing is between about 15 nm to about 30 nm.

Another aspect of the invention provides a method 10 (as shown in FIG. 11), which includes: at 11, forming a first stack of first channel nanosheets 102 layered with first sacrificial nanosheets 104 (as shown in FIG. 1), wherein the first sacrificial nanosheets are of a first thickness; at 12, masking and etching the first stack to form an open area 204; and, at 14, forming, in the open area, a second stack of second channel nanosheets 304 layered with second sacrificial nanosheets 306 (as shown in FIG. 3), wherein the second sacrificial nanosheets are of a second thickness that is greater than the first thickness.

In one or more embodiments, the method also includes, at 18, forming recesses by indenting ends of the first and second sacrificial nanosheets; and at 20-22, forming inner spacers in the recesses at the ends of the first sacrificial nanosheets, but not in the recesses at the ends of the second sacrificial nanosheets. In one or more embodiments, forming inner spaces includes: at 20, depositing a conformal dielectric liner over the first stack and the second stack, to a thickness that is at least one half a height of the recesses at the ends of the first sacrificial nanosheets but less than one half a height of the recesses at the ends of the second sacrificial nanosheets, thereby forming pinched off portions of the liner in the recesses at the ends of the first sacrificial nanosheets; and, at 22, isotropically etching the liner, such that the pinched off portions remain after etching and form the inner spacers in the recesses at the ends of the first sacrificial nanosheets.

In one or more embodiments, the method also includes, at 24, forming source/drain structures adjacent to the first and second stacks.

In one or more embodiments, the method also includes, at 26-28, replacing the first and second sacrificial nanosheets with respective first and second gate stacks; and forming the second gate stack with an oxide layer that is thicker than an oxide layer of the first gate stack, so that the source/drain structure that is adjacent to the second stack directly contacts the oxide layer of the second gate stack.

In one or more embodiments, the method also includes forming the first gate stack with an oxide thickness between about 0.5 nm to about 1.5 nm; and forming the second gate stack with an oxide thickness between about 3 nm to about 7 nm.

In one or more embodiments, the method also includes forming the first sacrificial nanosheets to a thickness between about 5 nm to about 15 nm thick; and forming the second sacrificial nanosheets to a thickness between about 15 nm to about 30 nm thick.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures.

A number of different precursors may be used for the epitaxial deposition of the in situ doped semiconductor material. In some embodiments, the gas source for the deposition of an epitaxially formed in situ doped semiconductor material may include silicon (Si) deposited from silane, di silane, trisilane, tetrasilane, hexachlorodisilane, tetrachlorosilane, dichlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

By "in-situ" it is meant that the dopant that dictates the conductivity type of doped layer is introduced during the process step, for example epitaxial deposition, which forms the doped layer. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

As used herein, the term "conductivity type" denotes a dopant region being p-type or n-type. As further used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. Examples of n-type dopants, i.e., impurities in a silicon-containing substrate include but are not limited to antimony, arsenic and phosphorous.

As an exemplary subtractive process, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (ME), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. More-over, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

Various structures that are described herein, e.g., source/drain structures, may be epitaxially grown. "Epitaxy" or "epitaxial growth," as used herein, refers to a process by which a layer of single-crystal or large-grain polycrystalline material is formed on an existing material with similar crystalline properties. One feature of epitaxy is that this process causes the crystallographic structure of the existing substrate or seed layer (including any defects therein) to be reproduced in the epitaxially grown material. Epitaxial growth can include heteroepitaxy (i.e., growing a material with a different composition from its underlying layer) or homoepitaxy (i.e., growing a material which includes the same composition as its underlying layer). Heteroepitaxy can introduce strain in the epitaxially grown material, as its crystal structure may be distorted to match that of the underlying layer. In certain applications, such strain may be desirable. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Gate stacks in both nFET and pFET structures (in embodiments having both types of regions) include work function material (WFM) layers. Non-limiting examples of suitable work function (gate) metals include p-type work function materials and n-type work function materials. P-type work function materials include compositions such as ruthenium, palladium, platinum, cobalt, nickel, and conductive metal nitride like TiN, WN, or any combination thereof. N-type work function materials include compositions such as hafnium, zirconium, titanium, tantalum, aluminum, metal carbides (e.g., hafnium carbide, zirconium carbide, titanium carbide, and aluminum carbide), aluminides, or any combination thereof.

The work function material(s) may be deposited by a suitable deposition process, for example, ALD, CVD, PECVD, PVD, plating, and thermal or e-beam evaporation. Pinch-off of work function material between semiconductor fins is essentially avoided during deposition. The WFM layer is removed from one of the nFET and pFET regions in structures including both types of regions while the other region is protected. An SC1 etch, an SC2 etch or other suitable etch processes can be employed to remove the selected portion of the originally deposited WFM layer. A new WFM layer suitable for the region is then deposited. A device formed in the nFET region will accordingly include a WFM layer (gate electrode) having a first composition while a device in the pFET region will have a WFM layer having a second composition. For example, the WFM employed in an nFET region may be a Ti, Al, TiAl, TiAlC or TiAlC layer or a metal stack such as TiN/TiAl/TiN, TiN/TiAlC/TiN, TiN/TaAlC/TiN (generally, multiple work function metals can be included in a gate stack), or any combination of an aluminum alloy and TiN layers. The WFM layer employed in the pFET region may, for example, be a TiN, TiC, TaN or a tungsten (W) layer. The threshold voltage (Vt) of nFET devices is sensitive to the thickness of work function materials such as titanium nitride (TiN).

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

What is claimed is:

1. A semiconductor device comprising:
   a semiconductor substrate;
   a first nanosheet transistor, which is located on the substrate, that has a first inter-channel spacing and that has a gate oxide layer,
   wherein the first nanosheet transistor comprises first channel structures of a first thickness between 4 nm to 8 nm; and
   a second nanosheet transistor, which is located on the substrate, that has a second inter-channel spacing that is greater than the first inter-channel spacing and that has a gate oxide layer that is thicker than the gate oxide layer of the first nanosheet transistor,
   wherein the second nanosheet transistor comprises second channel structures of a second thickness between 4 nm to 12 nm which is different than the first thickness, and
   wherein the second nanosheet transistor comprises a second source/drain structure that wraps around the ends of the second channel structures.

2. The semiconductor device of claim 1, wherein the second source/drain structure directly contacts the gate oxide layer of the second nanosheet transistor, and wherein the first nanosheet transistor comprises a first source/drain structure and inner spacers that separate the first source/drain structure of the first nanosheet transistor from the gate oxide layer of the first nanosheet transistor.

3. The semiconductor device of claim 2, wherein a thickness of the inner spacers of the first nanosheet transistor is one-half of the first inter-channel spacing.

4. The semiconductor device of claim 1, wherein the first nanosheet transistor comprises a first metal gate stack and the second nanosheet transistor comprises a second metal gate stack.

5. The semiconductor device of claim 4, wherein the first metal gate stack comprises a first work function metal and the second metal gate stack comprises a second work function metal that is different than the first work function metal.

6. The semiconductor device of claim 4, wherein the first metal gate stack comprises a dielectric that includes silicon.

7. The semiconductor device of claim 6, wherein the dielectric of the first metal gate stack includes hafnium.

8. The semiconductor device of claim 7, wherein the dielectric of the first high k-metal gate stack includes silicon dioxide and hafnium dioxide.

9. The semiconductor device of claim 4, wherein the first high-k metal gate stack comprises a first dielectric and the second high k-metal gate stack comprises a second dielectric that includes a different oxide than is included in the first dielectric.

10. The semiconductor device of claim 1, wherein the first channel structures have a first length and the second channel structures have a second length that is different than the first length.

11. The semiconductor device of claim 1, wherein the first inter-channel spacing is between 5 nm to 15 nm, and the second inter-channel spacing is between 15 nm to 30 nm.

\* \* \* \* \*